United States Patent
Sinton et al.

(10) Patent No.: US 9,480,952 B2
(45) Date of Patent: Nov. 1, 2016

(54) METHODS FOR CHEMICAL REACTION PERFORATION OF ATOMICALLY THIN MATERIALS

(71) Applicant: LOCKHEED MARTIN CORPORATION, Bethesda, MD (US)

(72) Inventors: Steven W. Sinton, Palo Alto, CA (US); Peter V. Bedworth, Los Gatos, CA (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 75 days.

(21) Appl. No.: 14/200,195

(22) Filed: Mar. 7, 2014

(65) Prior Publication Data

US 2014/0263178 A1    Sep. 18, 2014

Related U.S. Application Data

(60) Provisional application No. 61/782,124, filed on Mar. 14, 2013.

(51) Int. Cl.

| | |
|---|---|
| *B01D 67/00* | (2006.01) |
| *B82Y 40/00* | (2011.01) |
| *C01B 31/04* | (2006.01) |
| *B01D 65/10* | (2006.01) |
| *B01D 71/02* | (2006.01) |
| *H01L 29/16* | (2006.01) |

(52) U.S. Cl.
CPC ......... *B01D 67/0053* (2013.01); *B01D 65/108* (2013.01); *B01D 67/006* (2013.01); *B01D 71/021* (2013.01); *B82Y 40/00* (2013.01); *C01B 31/0438* (2013.01); *C01B 31/0446* (2013.01); *C01B 31/0484* (2013.01); *H01L 29/1606* (2013.01)

(58) Field of Classification Search
None
See application file for complete search history.

(56) References Cited

U.S. PATENT DOCUMENTS

| | | | |
|---|---|---|---|
| 8,361,321 B2 | 1/2013 | Stetson et al. | ................ 210/652 |
| 8,979,978 B2 * | 3/2015 | Miller | .................... B01D 53/22 |
| | | | 95/43 |
| 9,028,663 B2 | 5/2015 | Stetson et al. | |
| 9,067,811 B1 | 6/2015 | Bennett et al. | |
| 9,095,823 B2 | 8/2015 | Fleming et al. | |
| 2010/0105834 A1 | 4/2010 | Tour et al. | ....................... 525/50 |
| 2011/0201201 A1 * | 8/2011 | Arnold | ................... B82Y 30/00 |
| | | | 438/694 |
| 2012/0048804 A1 * | 3/2012 | Stetson | .................. B01D 61/02 |
| | | | 210/653 |
| 2012/0255899 A1 | 10/2012 | Choi et al. | ..................... 210/489 |
| 2013/0015136 A1 | 1/2013 | Bennett et al. | |
| 2013/0105417 A1 | 5/2013 | Stetson et al. | |

(Continued)

FOREIGN PATENT DOCUMENTS

WO    WO2011/094204 A2    8/2011    ............ C01B 31/02

OTHER PUBLICATIONS

Fischbein et al. (Sep. 16, 2008), "Electron beam nanosculpting of suspended graphene sheets", Appl. Phys. Lett., 2008, 93 113107.

(Continued)

*Primary Examiner* — Jiong-Ping Lu
(74) *Attorney, Agent, or Firm* — Foley & Lardner LLP

(57) ABSTRACT

A method for forming a lattice with precisely sized holes includes disposing cutter molecules with species attached about the periphery of each molecule on to the lattice. The method continues with the species cutting molecular bonds of the lattice so as to form precisely sized holes in the lattice. The edges of the holes may then be functionalized.

14 Claims, 11 Drawing Sheets

(56) References Cited

U.S. PATENT DOCUMENTS

| | | |
|---|---|---|
| 2013/0240355 A1 | 9/2013 | Ho et al. |
| 2013/0248367 A1 | 9/2013 | Stetson et al. |
| 2013/0249147 A1 | 9/2013 | Bedworth |
| 2013/0256210 A1 | 10/2013 | Fleming |
| 2013/0256211 A1 | 10/2013 | Fleming |
| 2013/0270188 A1* | 10/2013 | Karnik ............... B01D 53/228 210/650 |
| 2013/0277305 A1 | 10/2013 | Stetson et al. |
| 2014/0261999 A1 | 9/2014 | Stetson et al. |
| 2014/0263035 A1 | 9/2014 | Stoltenberg et al. |
| 2014/0272286 A1 | 9/2014 | Stoltenberg et al. |
| 2014/0377738 A1 | 12/2014 | Bachmann et al. |
| 2015/0075667 A1 | 3/2015 | McHugh et al. |
| 2015/0217219 A1 | 8/2015 | Sinsabaugh et al. |
| 2015/0218210 A1 | 8/2015 | Stetson et al. |
| 2015/0221474 A1 | 8/2015 | Bedworth et al. |
| 2015/0247178 A1 | 9/2015 | Mountcastle et al. |
| 2015/0258254 A1 | 9/2015 | Simon et al. |
| 2015/0258498 A1 | 9/2015 | Simon et al. |
| 2015/0258502 A1 | 9/2015 | Turowski et al. |
| 2015/0258503 A1 | 9/2015 | Sinton et al. |
| 2015/0258525 A1 | 9/2015 | Westman et al. |
| 2015/0268150 A1 | 9/2015 | Newkirk et al. |
| 2015/0321147 A1 | 11/2015 | Fleming et al. |
| 2015/0336202 A1 | 11/2015 | Bedworth et al. |
| 2016/0009049 A1 | 1/2016 | Stoltenberg et al. |

OTHER PUBLICATIONS

Hashimoto et al. (Aug. 19, 2004), "Direct evidence for atomic defects in graphene layers", Nature 2004 430 870-3.

Humplik et al. (Jun. 17, 2011), "Nanostructured materials for water desalination", Nanotechnology 22 (2011) 292001.

Inui et al. (Dec. 19, 2009), "Molecular dynamics simulations of nanopore processing in a graphene sheet by using gas cluster ion beam", Appl. Phys. 2010 A 98 787-94.

Lucchese et al. (Jan. 6, 2010), "Quantifying ion-induced defects and Raman relaxation length in graphene", Carbon 2010 48 1592-7.

Plant et al. (Oct. 29, 2013), "Size-dependent propagation of Au nanoclusters through few-layer grapheme," The Royal Society of Chemistry 2013, Nanoscale.

Wang et al. (Feb. 3, 2014), "Direct Observation of a Long-Lived Single-Atom Catalyst Chiseling Atomic Structures in Graphene," Nano Lett., 2014, pp. A-F.

Wang et al. (Jul. 31, 2013), "Porous Nanocarbons: Molecular Filtration and Electronics," Advances in Graphene Science, Edited by Mahmood Aliofkhazraei, ISBN 978-953-51-1182-5, Publisher: InTech; Chapter 6, pp. 119-160.

Wei et al. (Mar. 27, 2009), "Synthesis of N-doped graphene by chemical vapor deposition and its electrical properties", Nano Lett. 2009 9 1752-58.

Zan et al. (Mar. 8, 2012), "Interaction of Metals with Suspended Graphene Observed by Transmission Electron Microscopy", J. Phys. Chem. Lett. 2012, 3, 953-958.

Zhang et al. (Mar. 27, 2003), "Effect of chemical oxidation on the structure of single-walled carbon nanotubes", J. Phys. Chem., 2003, B 107 3712-8.

Zhang et al. (May 6, 2010), "Production of Graphene Sheets by Direct Dispersion with Aromatic Healing Agents", Small 2010, x, No. x, 1-8.

International Preliminary Report on Patentability dated Sep. 24, 2015, corresponding to International Patent Application No. PCT/US2014/023043.

Kim et al.; *Fabrication and Characterization of Large-Area, Semi-conducting Nanoperforated Graphene Materials*; Nano Letters, American Chemical Society; vol. 10, No. 4; Apr. 2010; pp. 1125-1131.

Childres et al.; *Effect of oxygen plasma etching on graphene studied using Raman spectroscopy and electronic transport measurements*; New Journal of Physics; Feb. 2011, Institute of Physics Publishing GBR; vol. 13; Feb. 2011.

Kim et al.; *The structural and electrical evolution of graphene by oxygen plasma-induced disorder*; Nanotechnology IOP Publishing Ltd., UK; vol. 20, No. 37; Sep. 16, 2009;.

Zhang et al.; *Method for anisotropic etching of graphite or graphene*; Database CA (online) Chemical Abstracts Service, Columbus Ohio; Apr. 28, 2011 (database accession No. 154:448762) & CN 101 996 853 (Institute of Physics, Chinese Academy of Sciences, Peop. Rep. China; Mar. 30, 2011.

Bai (Jingwei) et al.; *Graphene nanomesh*; Nature Nanotechnology; Feb. 14 2010.

Jiang et al.; *Porous Graphene as the Ultimate Membrane for Gas Separation*; Nano Letters 20091209; American Chemical Society USA; vol. 9, No. 12; Dec 9, 2009; pp. 4019-4024.

Liu et al.; *Graphene Oxidation: Thickness-Dependent Etching and Strong Chemical Doping*; Nano Letters 2008; American Chemical Society; vol. 8, No. 7; 1965-1970; Jun. 19, 2009.

Cohen-Tanugi et al.; *Water Desalination across Nanoporous Graphene*; NanoLett; American Chemical Society; Jun. 1, 1012.

Suk et al.; *Water Transport through Ultrathin Graphene*; American Chemical Society; J. Phys. Chem. Lett; 2010; Apr. 30, 2010; pp. 1590-1594.

International Search Report mailed Jun. 6, 2014 in corresponding application No. PCT/US2014/023043.

Written Opinion mailed Jun. 6, 2014 in corresponding application No. PCT/US2014023043.

International Search Report mailed Jun. 19, 2013 in corresponding application No. PCT/US2013/030344.

Written Opinion mailed Jun. 19, 2013 in corresponding application No. PCT/US2013/030344.

* cited by examiner

Napthelene, C$_{10}$H$_8$

X$_8$-Napthelene, C$_{10}$X$_8$

Anthracene, $C_{14}H_{10}$

Perylene, $C_{20}H_{12}$

METHODS FOR CHEMICAL REACTION PERFORATION OF ATOMICALLY THIN MATERIALS

CROSS REFERENCE TO RELATED APPLICATION

This application claims priority of Provisional application Ser. No. 61/782,124 filed Mar. 14, 2013 and which is incorporated herein by reference.

TECHNICAL FIELD

The present invention is generally directed to the formation of perforations in atomically thin materials. More particularly, the present invention relates to a method of chemically cleaving an opening in an atomically thin material such as graphene so as to provide precisely sized apertures in the nanometer range.

BACKGROUND ART

The ability to manipulate individual atoms for use in nanotechnology components continues to develop. Some of these developments are in the field of materials and specifically atomically thin materials which may use a single molecular component or selected combinations of molecular components. One example of such a material is graphene which is a two-dimensional aromatic polymer that has a multitude of applications ranging from electronic memory, electrical storage, composite enhancement, membranes and the like. Other atomically thin materials are believed to have their own beneficial properties.

A graphene membrane is a single-atomic-layer-thick layer of carbon atoms, bound together to define a sheet. The thickness of a single graphene membrane, which may be referred to as a layer or a sheet, is approximately 0.2 to 0.3 nanometers (nm) thick, or as sometimes referred to herein "thin." The carbon atoms of the graphene layer define a repeating pattern of hexagonal ring structures (benzene rings) constructed of six carbon atoms, which form a honeycomb lattice of carbon atoms. An interstitial aperture is formed by each six carbon atom ring structure in the sheet and this interstitial aperture is less than one nanometer across. Indeed, skilled artisans will appreciate that the interstitial aperture is believed to be about 0.23 nanometers across at its longest dimension. Accordingly, the dimension and configuration of the interstitial aperture and the electron nature of the graphene precludes transport of any molecule across the graphene's thickness unless there are perforations.

Recent developments have focused upon graphene membranes for use as filtration membranes in applications such as salt water desalination. One example of such an application is disclosed in U.S. Pat. No. 8,361,321 which is incorporated herein by reference. As these various uses of graphene and other atomically thin materials develop, there is a need to manufacture relatively large area graphene sheets for use in filtration applications and other uses.

Without considering the possibility of lattice defects, the carbon atoms in graphene, or other atoms in an atomically thin layer, are so closely spaced that a sheet or layer of the material is essentially impermeable to most substances. However, if holes with the proper dimensions are made in the layer, molecules smaller than these holes can readily pass through the layer. Molecules with dimensions larger than the holes will not be able pass through the layer. In the case of graphene, such a layer with properly sized holes is a "molecular filter," and it can be used to separate molecules based on their size differences. With properly sized holes, a perforated graphene layer becomes a nano-filter or ultra-filter. Because of its extreme thinness, the energy cost for moving a molecule across such a molecular membrane is lower than other competing filtration membranes that rely on Solution-Diffusion mechanisms for separation.

Various methodologies are known to form nano-sized to micro-sized holes in an atomically thin layer such as graphene. It is known to form graphene apertures or holes by selective oxidation, by which is meant exposure to an oxidizing agent for a selected period of time. It is believed that graphene apertures can also be formed by charged particle bombardment thereafter followed by the aforementioned selective oxidation. As described in the publication Nano Lett. 2008, Vol. 8, no. 7, pg 1965-1970, the most straightforward perforation strategy is to treat the graphene film with dilute oxygen in argon at elevated temperature. As described therein, through apertures or holes in the 20 to 180 nm range were etched in graphene using 350 mTorr of oxygen in 1 atmosphere (atm) argon at 500° C. for 2 hours. The paper reasonably suggests that the number of holes is related to defects in the graphene sheet and the size of the holes is related to the residence time. This is believed to be an established method for making the desired perforations in graphene structures. The structures may be graphene nanoplatelets and graphene nanoribbons. Thus, apertures in the desired range can be formed by shorter oxidation times. Another more involved method as described in Kim et al. "*Fabrication and Characterization of Large Area, Semiconducting Nanoperforated Graphene Materials*," Nano Letters 2010 Vol. 10, No. 4, Mar. 1, 2010 pp 1125-1131, utilizes a self assembling polymer that creates a mask suitable for patterning using reactive ion etching (RIE). A P(S-blockMMA) block copolymer forms an array of PMMA columns that form vias for the RIE upon redeveloping. The pattern of holes is very dense. The number and size of holes is controlled by the molecular weight of the PMMA block and the weight fraction of the PMMA in the P(S-MMA). Either method has the potential to produce perforated graphene sheets.

Chemical methods (such as oxidation or doping) of creating holes in graphene generally operate by nucleating defects in the graphene lattice and growing holes through bond breaking at these defects. Since the defect nucleation and hole growth occur simultaneously across the graphene, a wide range of hole sizes is created. It is difficult to control the oxidation process to simultaneously keep hole dimensions small (nanoscopic) and the hole distribution narrow.

The above-mentioned methodologies create nanometer sized holes in graphene, but the preponderance of holes created are not in the size range (below 10 nm diameter) required for applications such as desalination. Although the above methodologies are adequate at forming a desired size of hole, several of those methods do not consistently provide the same size holes. For example, an operation to form holes may generate some holes having a diameter of 1.2 nm and other holes having a diameter of 2.5 nm. Typically, methods such as oxidation that create holes via initial nucleation of defects in graphene followed by growth of holes yield a range of hole sizes because the nucleation and growth processes proceed at the same time. Holes that start growth (from nucleations) earlier in the process will end up larger than holes that start growing later in the process. When the process is finished, there will be a range of hole sizes. In applications based on filtration size sieving this wide of a variation in hole diameter can be unacceptable as the membrane will be unable to discriminate between molecules that are desired and molecules that are not desired. Therefore, there is a need in the art to perforate graphene and other atomically thin membranes with precisely sized holes or apertures at the nanometer level to achieve precise size-based filtration. There is also a need to generate such perforated graphene with methods that are scalable for mass production.

SUMMARY OF THE INVENTION

In light of the foregoing, it is a first aspect of the present invention to provide a method for chemical reaction perforation of atomically thin materials.

It is another aspect of the present invention to provide a method for forming a lattice with precisely sized holes, comprising disposing cutter molecules with species attached about the periphery of each molecule on to the lattice, the species cutting molecular bonds of the lattice so as to form precisely sized holes in the lattice.

BRIEF DESCRIPTION OF THE DRAWINGS

These and other features and advantages of the present invention will become better understood with regard to the following description, appended claims, and accompanying drawings wherein:

FIGS. 9A, 10A, 11A, 12A, and 13A are examples of different sized lattice holes in a graphene lattice. These figures are intended to be illustrative of the relation between hole size and shape and number of lattice carbon atoms missing. FIGS. 9B, 10B, 11B, 12B, and 13B are similar to the corresponding "A" Figs. except oxygen atoms are bonded to carbon atoms that form edges of the hole. These Figs. schematically show how the holes change with carbon-oxygen bonding at their edges. These schematic representations illustrate potential embodiments. All the dimensional notations are in Angstroms.

BEST MODE FOR CARRYING OUT THE INVENTION

Figure 1:
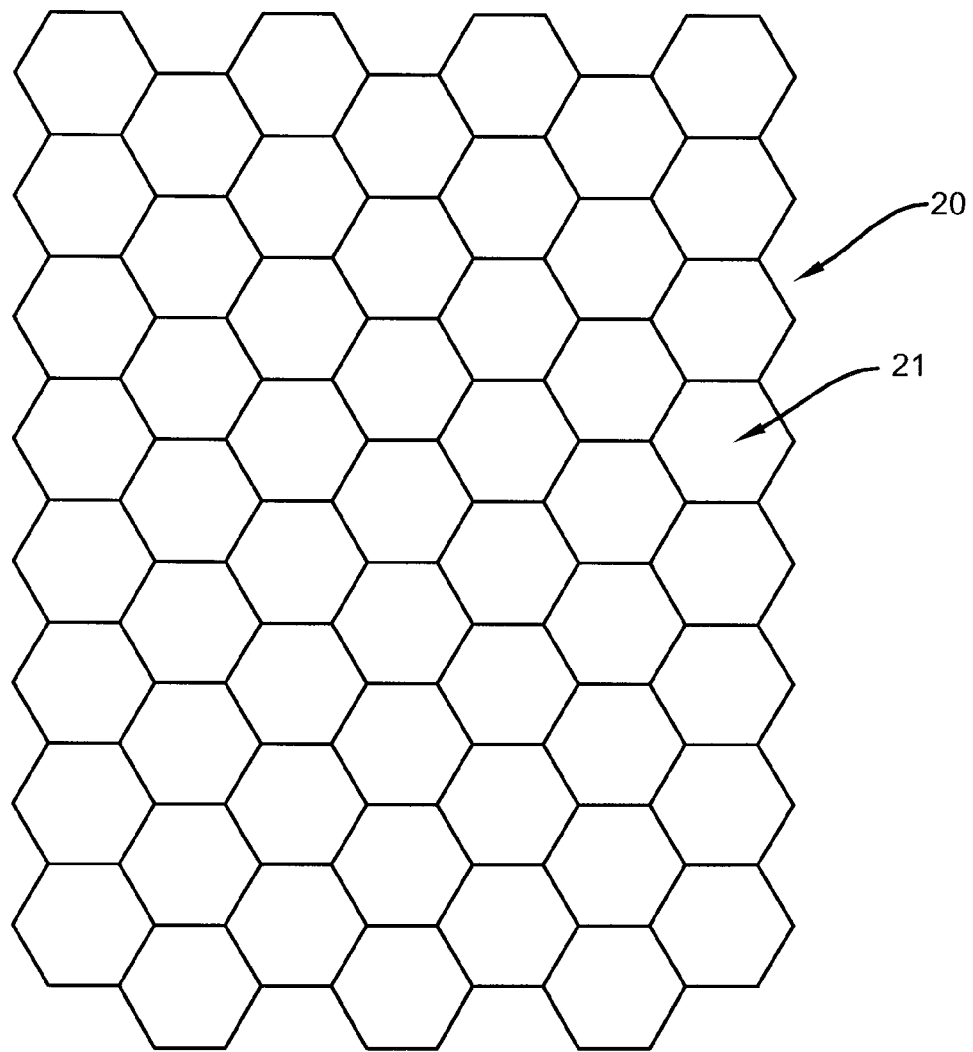
FIG. 1 is a schematic representation of a graphene lattice or membrane according to the concepts of the present invention.

Generally, the present invention uses a carrier molecule with reactive substituents on its periphery to "cut" the molecular bonds in an atomically thin lattice, layer or membrane, thereby removing a piece of the lattice and leaving behind a hole. In an embodiment where the atomically thin material is graphene, the carrier molecule cuts the carbon-carbon bonds of the lattice or membrane. The hole geometry (shape, size) is defined by the shape and size of the carrier molecule. The reactive substituents on the carrier molecule enable cleavage of molecular bonds, thereby breaking neighboring bonds holding a portion of lattice structure. When that portion leaves, the hole left has a size/shape defined by the size/shape of the carrier molecule. When this chemistry is being done with pure cutter molecules, all the holes so formed are believed to be of exactly the same size. As a result, a "monodisperse" hole-size distribution is created in the atomically thin material such as in one embodiment—graphene. This discriminates this invention from other hole-forming processes, such as oxidation methods, that rely on hole growth and which produce broad hole-size distributions.

A key technical enabler for an atomically thin material used in molecular filter technology or other applications, is the ability to make holes, apertures, or perforations in an atomically thin material of desired dimensional range. Indeed, it is desired to form uniform nanometer (molecular sized) apertures having a range of 0.3 to 10 nm in size, and in some applications the aperture size can range from 0.5 nm up to 100 nm or more. For example purposes only, water and ion transport across a graphene layer with a hole of variable size was modeled and resulting hole sizes and the number of carbon atoms that must be removed from a graphene lattice to create these holes was established. As seen in the Table below, the analysis of the graphene structure and a desired hole size is presented.

| Specified Diameter (Angstroms) | # Carbon Atoms Removed | # Oxygen atoms added | Net number of lattice positions removed to create hole | Ultimate effective diameter (after Oxygen functionalization) in Angstroms |
|---|---|---|---|---|
| 6 | 13 | 9 | 4 | 5.28 |
| 8 | 19 | 12 | 7 | 7.51 |
| 10 | 31 | 15 | 16 | 10.19 |
| 13 | 46 | 18 | 28 | 12.03 |
| 14 | 58 | 21 | 37 | 12.93 |
| 15 | 67 | 21 | 46 | 14.38 |
| 18 | 103 | 27 | 76 | 18.2 |
| 21 | 130 | 30 | 100 | 20.03 |
| 23 | 163 | 33 | 130 | 22.46 |

The process to form such holes in graphene was not developed in the model. However, from the model it was determined that removing anywhere from 4 to 37 carbon atoms would result in holes from about 5 to 13 Angstroms in diameter. Separately, molecular dynamics calculations show that holes in this size range effectively prevent ions from passing while allowing water molecules to flow through the membrane. Representations of these first five models from the Table above are shown in FIGS. 9-13 and will be discussed later.

Again, for example purposes only, making holes of proper size in graphene, the resulting membrane can be used to remove unwanted species from a fluid (or gas), or capture a rare but desired species by enriching its concentration in a solution (or gas). Purification of seawater by reverse osmosis through a perforated graphene filter becomes possible if the graphene holes are on the order of or smaller than seawater salt ions hydration radii. The requirement for the holes to be large enough to pass water unimpeded, while small enough to block most salt ions, puts a strong constraint on the permissible hole range. It is estimated that hole diameters must be between about 0.5 and 1.4 nm (5 to 14 Angstroms) for effective seawater desalination through a graphene filter. Other embodiments can provide holes that range from 0.5 nm to 2.2 nm.

In the process to be discussed, hole nucleation is replaced by reaction chemistry at the periphery of the carrier molecule, and hole size is determined by the physical dimensions of that molecule, rather than growth of a hole. As envisioned, there is no hole growth kinetics in the following process, although subsequent hole growth processes (such as mild oxidation) could be applied to further enlarge holes formed by this method, thereby preserving the monodispersity for larger desired hole sizes. Moreover, all holes are of the same size, as determined by the carrier molecule size. As long as the size distribution of carrier molecules is monodisperse, the hole sizes will likewise be monodisperse. Through proper choice of a cutter molecule and peripheral chemistry, one can create holes of only a desired size in graphene, thus enabling the desired filtration effect.

Referring now to FIGS. 1-4, a methodology for forming a lattice with precisely sized holes is disclosed. In the embodiments disclosed, specific reference is made to graphene; however skilled artisans will appreciate that the methodology disclosed herein is applicable to the formation of consistently sized apertures in any atomically thin material. By way of example only, other atomically thin materials are few layer graphene, molybdenum disulfide, boron nitride, hexagonal boron nitride, niobium diselenide, silicene, and germanene.

In FIG. 1 a lattice is designated generally by the numeral 20. The lattice 20 is a graphene sheet or layer, which may sometimes be referred to as a membrane, represented by interconnected hexagonal rings. In the disclosed embodiments, the graphene sheets can be formed, having greater thickness and correspondingly greater strength. Multiple graphene sheets can be provided in multiple layers as the sheet is grown or formed. Or multiple graphene sheets can be achieved by layering or positioning one sheet on top or another. For all the embodiments disclosed herein, a single sheet of atomically thin material or multiple atomically thin sheets may be used and any number of sheets may be used to form the lattice. Testing reveals that multiple layers of graphene maintain their integrity and function as a result of self-adhesion. This improves the strength of the sheet and in some cases flow performance. In most embodiments, the graphene sheet may be 0.5 to 2 nanometers thick. The carbon atoms of the graphene lattice 20 define a repeating pattern of hexagonal ring structures (benzene rings) constructed of six carbon atoms, which form a honeycomb lattice of carbon atoms. An interstitial aperture 21 is formed by each six-carbon atom ring structure in the sheet and this interstitial aperture is less than one nanometer across. As noted, skilled artisans will appreciate that the interstitial aperture is believed to be about 0.23 nanometers across its longest dimension. And as previously discussed, the dimension and configuration of the aperture 21 and the electron nature of the graphene preclude transport of any molecule across the graphene's thickness unless there are perforations. This dimension of aperture 21 is much too small to allow the passage of either water or ions.

As will be discussed in detail, the precisely sized holes in a lattice 20 are formed by cutter molecules. As used herein, a cutter molecule is any molecule which provides reactive groups on its periphery that can cleave or activate the cleavage of the molecular bonds in an atomically thin material. By way of example only, the cutter molecules disclosed herein are used to cleave or activate the cleavage of carbon-carbon bonds in a graphene lattice. Ideally this molecule can associate with the graphene lattice such that all of its reactive groups are brought into close proximity to graphene carbon-carbon bonds at the same time. Examples are substituted versions referred to herein as planar molecules in the following figures. In such embodiments, the molecules have the same substantially planar multi-ring geometry as the graphene lattice. Attractive interactions between these planar cutter molecules and graphene lattice bring all the reactive substituents close to the graphene carbon-carbon bonds, thus increasing probability of cleaving graphene bonds in a geometry that results in the hole. Cutter molecules may also include any molecule or group of molecules or atoms that can cleave or activate the cleavage of carbon-carbon bonds in graphene over a limited dimension consistent with the desired nano-meter sized holes. One example is a metal cluster of aluminum or other metal atoms. Stable metal clusters of small numbers of metal atoms can be formed from a metal atom vapor and deposited on a surface. Some metals will react with carbon forming a metal carbide. If this reaction is carried out with a metal cluster on a graphene layer, the resulting carbide will form from the carbon lattice. In this way an area of carbon of dimension similar to the initial metal cluster size can be removed from a graphene lattice or other lattice material defined herein.

Figure 2:
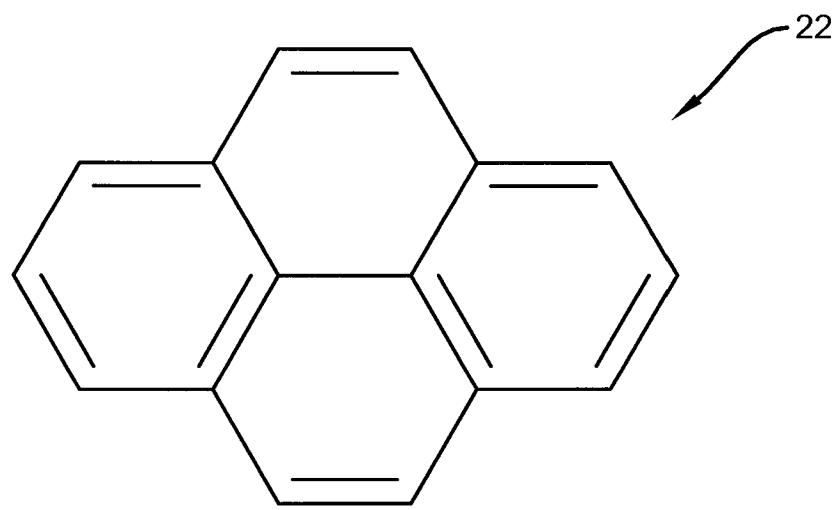
FIG. 2 is a diagram of an exemplary cutter molecule according to the concepts of the present invention.
Figure 3:
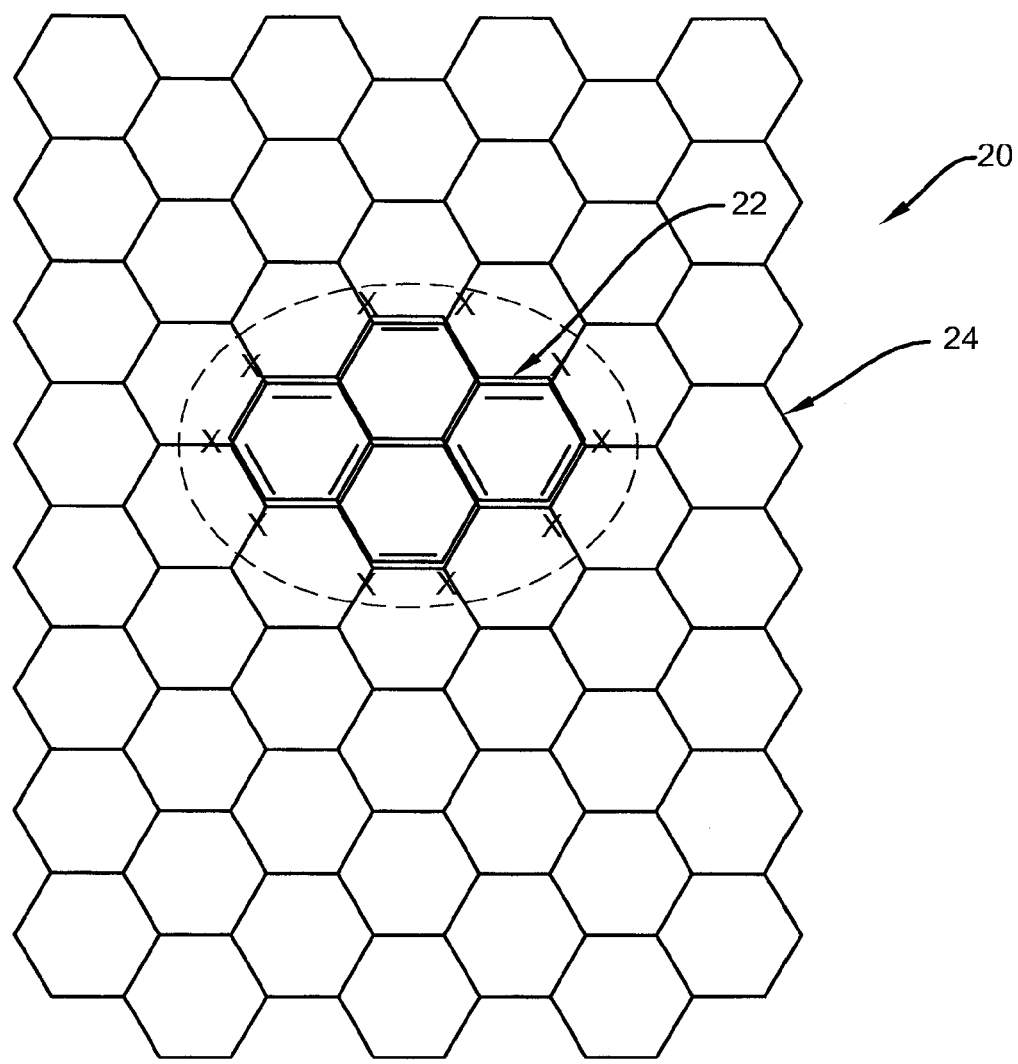
FIG. 3 is a schematic representation of the cutter molecule overlaying the graphene lattice according to the concepts of the present invention.

As best seen in FIG. 2, a cutter molecule, which in this case is a deca-substituted Pyrene $C_{16}H_{10}$, is designated by generally the numeral 22. In this embodiment, the cutter molecule 22 could be any carrier molecule that contains a 6-numbered aromatic ring. In other words, the molecule is able to lie relatively flat on the graphene lattice 20. Accordingly, as seen in FIG. 3, the cutter molecule 22 overlies the graphene lattice 20. The molecule utilizes a species designated as "X" in FIG. 3 and attaches to the lattice, which is now identified as a modified lattice 24, so that a periphery of the cutter molecules (the X substituents) break the carbon-carbon bonds in the graphene lattice 20. In other words, the cutter molecules bring the X substituents into ideal proximity of the carbon-carbon bonds to be cleaved. From the foregoing, skilled artisans will appreciate that the hydrogen atoms of the Pyrene are replaced by some other atom or poly-atomic species with chemical properties that enable carbon-carbon bond breaking. Exactly which carbon bonds are broken in this process may depend on the bond-breaking chemistry and the size of the "X" substituents. In FIG. 2 the X substituents are shown directly over carbon-carbon bonds immediately outside the pyrene carbon frame, but it will be recognized that the size of X substituents may dictate that bonds further from the pyrene carbon frame are chemically attacked. It will also be recognized by those skilled in the art that the resulting hole may also depend on what final bonding terminates the carbon hole edge and how the graphene lattice relaxes to its final shape after the cutting chemistry and any subsequent chemistry required to finalize the reaction sequence.

A further advantage is obtained if the molecule is composed of aromatic (benzene) rings or condensed poly cyclic rings. In this case, pi-pi electron interactions between cutter molecule and graphene assist in aligning the plane of the cutter molecule parallel to graphene lattice, bringing reactive substituents on the cutter molecule in close proximity to graphene carbon bonds. The X substituents are taken to be reactive groups capable of cleaving or assisting the cleavage of graphene carbon-carbon bonds. They could involve osmium chemistry (commonly known to assist carbon bond cleavage), various oxidizing groups, or bond-cleavage catalysts that can be attached to the carrier molecule. They could also be groups that activate or catalyze bond cleavage when external energy is added (light or heat) or other chemicals are added. When light is used, the molecule and/or the associated substituents react to light photons to initiate the cleaving process.

In another embodiment, the cutter molecule could be a cluster such as a metal cluster where metal atoms bind with graphene carbon-carbon bonds, thereby making them weaker or more reactive to other bond-cleaving chemistries. In this case, the size and shape of metal cluster interacting with graphene would define the hole-size produced, along with hole-edge bond termination and lattice relaxation, as mentioned above. Metal clusters which might be appropriate for this approach include platinum or aluminum clusters. Both of these metals are known to interact with aromatic carbon bonds such as those present in graphene, and methods for forming stable metal clusters of platinum and aluminum are known.

Figure 4:
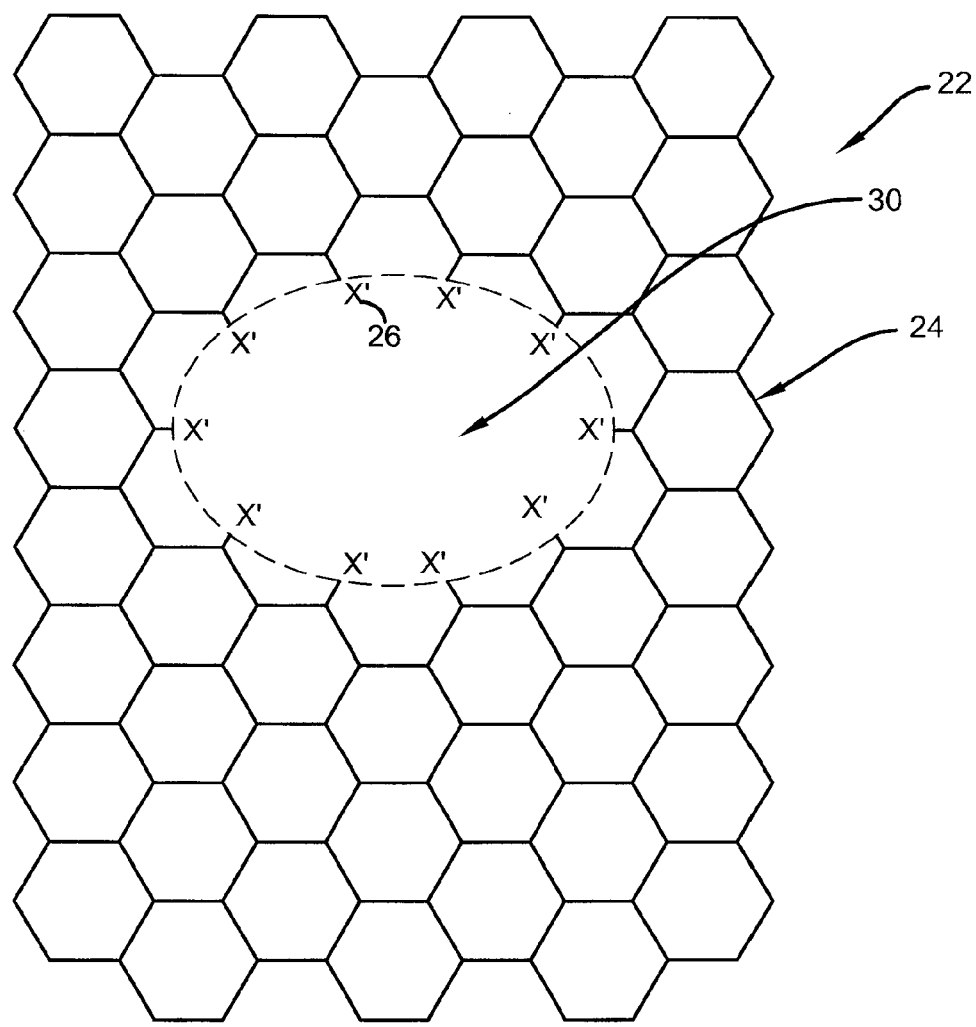
FIG. 4 is a schematic representation of a hole formed by the cutter molecule in the graphene lattice according to the concepts of the present invention.

As shown in FIG. 4, substituents of the cutter molecule cut or cleave the portion of the graphene lattice so as to leave behind a hole 30 with the dimensions and shape at least partly determined by the cutter molecule 22. Reaction with substituted pyrene may remove 16 carbon atoms or more. The exact size of hole created will depend on the size of the cutting X groups and size of substitution (X' 26) created on the graphene to satisfy carbon bonding chemistry. Ignoring these factors for simplicity, the hole reacted in the FIG. 4 scenario is about 6 to 8 Angstroms in size. This is within the size range required for seawater desalination by graphene or other high-flux membranes. Other arrangements of substituted pyrene interacting with graphene can also be envisioned. As skilled artisans will appreciate, when pure cutter or carrier molecules are used, the resulting hole size distribution is monodispersed. Of course, other types of cutter molecules could be used for larger or smaller holes, or other species, such as metal clusters, could be used to activate the carbon lattice for reaction.

Figure 5:
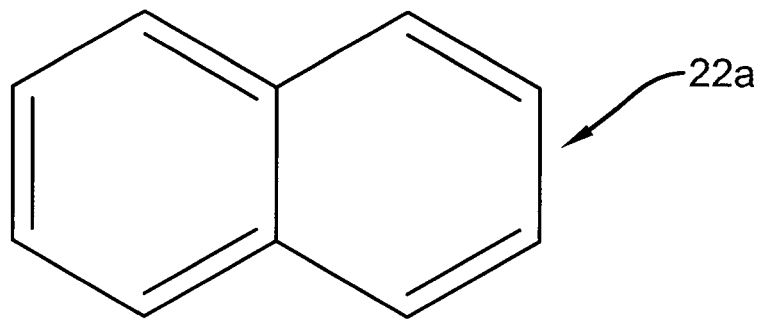
FIG. 5 is an example of another potential cutter molecule, such as Napthelene, according to the concepts of the present invention.
Figure 6:
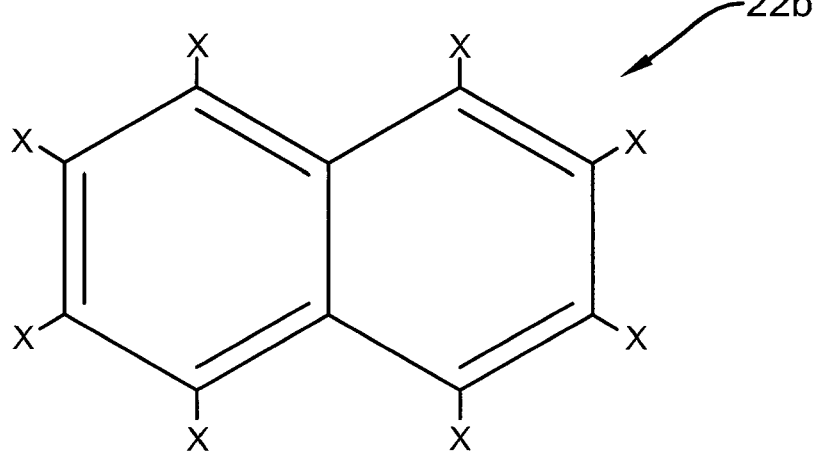
FIG. 6 is an example of another potential cutter molecule, such as a variation of Napthelene, according to the concepts of the present invention
Figure 7:
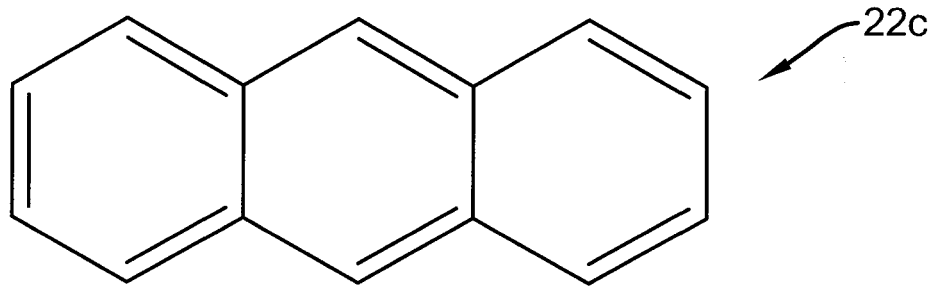
FIG. 7 is an example of another potential cutter molecule, such as Anthracene, according to the concepts of the present invention
Figure 8:
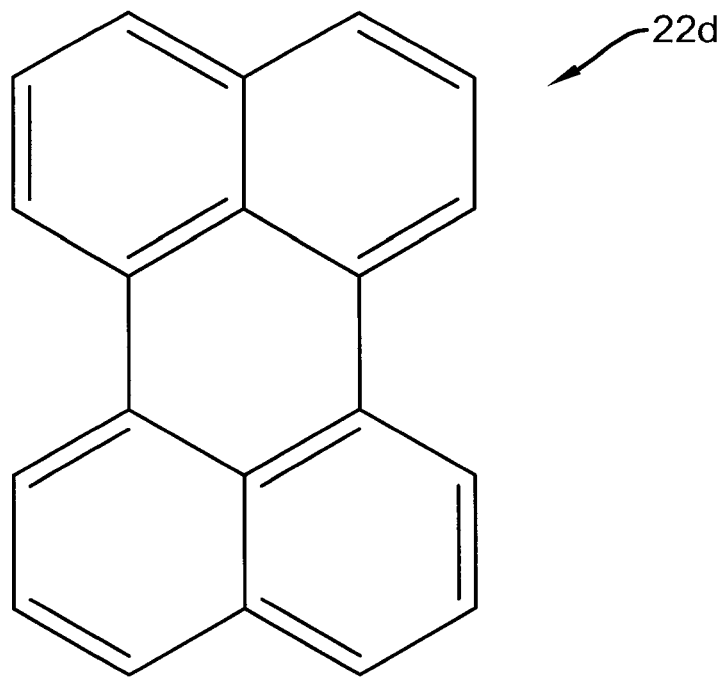
FIG. 8 is an example of another potential cutter molecule, such as Perylene, according to the concepts of the present invention.

Other types of cutter molecules are shown in FIGS. 5-8. In particular, FIG. 5 shows a cutter molecule 22a identified as Napthelene, $C_{10}H_8$. As in previous embodiments, the H is replaced by some other atom or poly-atomic species with chemical properties that enable carbon-carbon bond breaking. FIG. 6 shows a cutter molecule 22b identified as $X_8$—Napthelene, $C_{10}X_8$, wherein X represents some reactive species such as an osmium-bearing sidegroup or oxidizing sub-group, or the like that performs the cleaving chemistry required to break the carbon-carbon bonds in the graphene lattice. FIG. 7 shows a cutter molecule 22c identified as Anthracene, $C_{14}H_{10}$ and FIG. 8 shows a cutter molecule 22d identified as Perylene $C_{20}H_{12}$. In each of the FIGS. 2, 5, 7 and 8, the H atoms may be replaced by appropriate other atoms or poly-atomic species with chemical properties that enable carbon-carbon bond breaking to make a final cutter molecule.

Figure 9A:
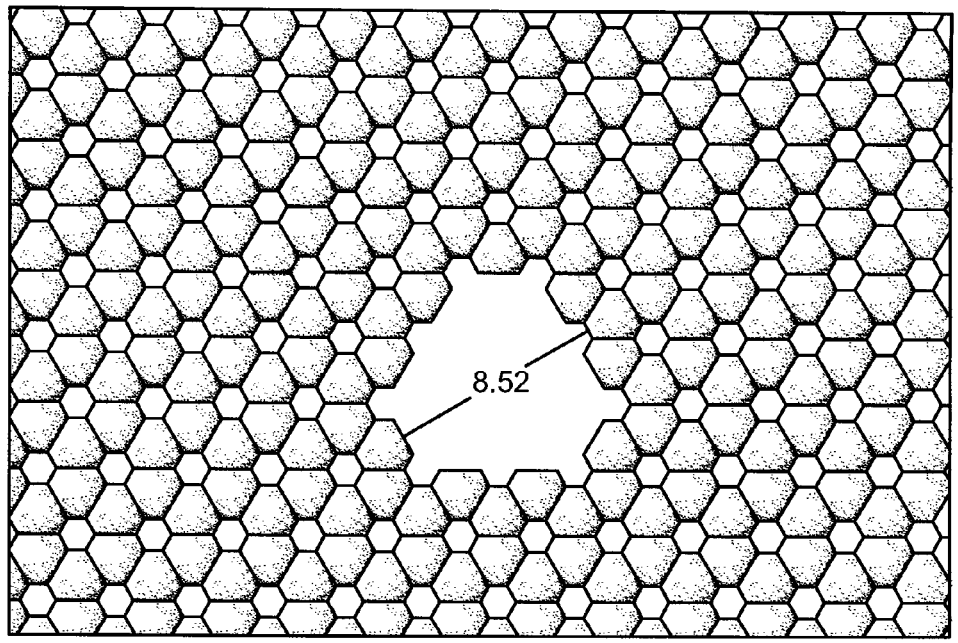
FIGS. 9A, 9B, 10A, 10B, 11A, 11B, 12A, 12B, 13A, and 13B are schematic representations of graphene lattices with holes wherein different numbers of carbon atoms are missing from the lattice and wherein carbon-oxygen bonds are or are not added to terminate hole edges.
Figure 9B:
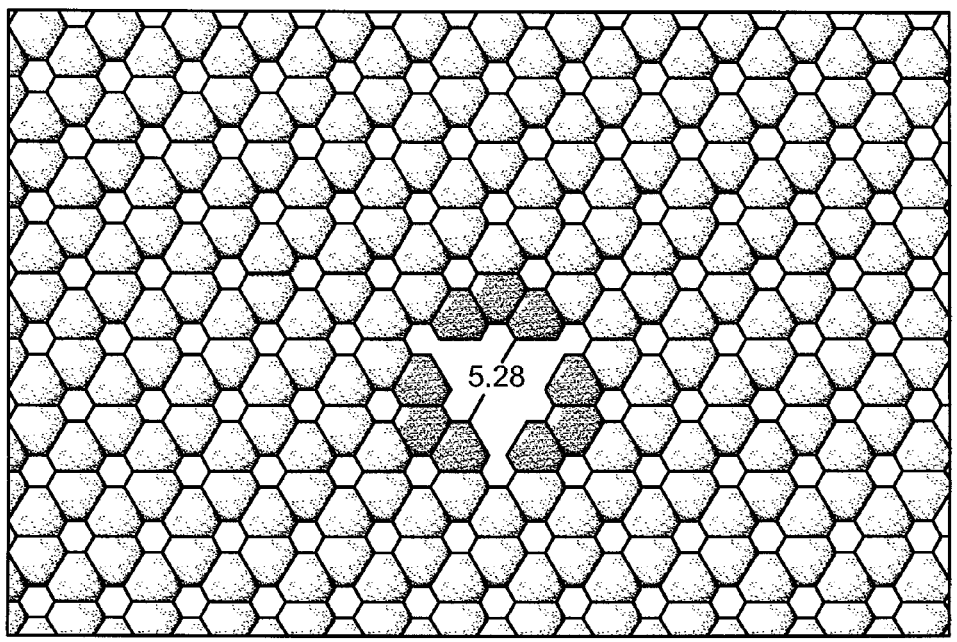
Figure 10A:
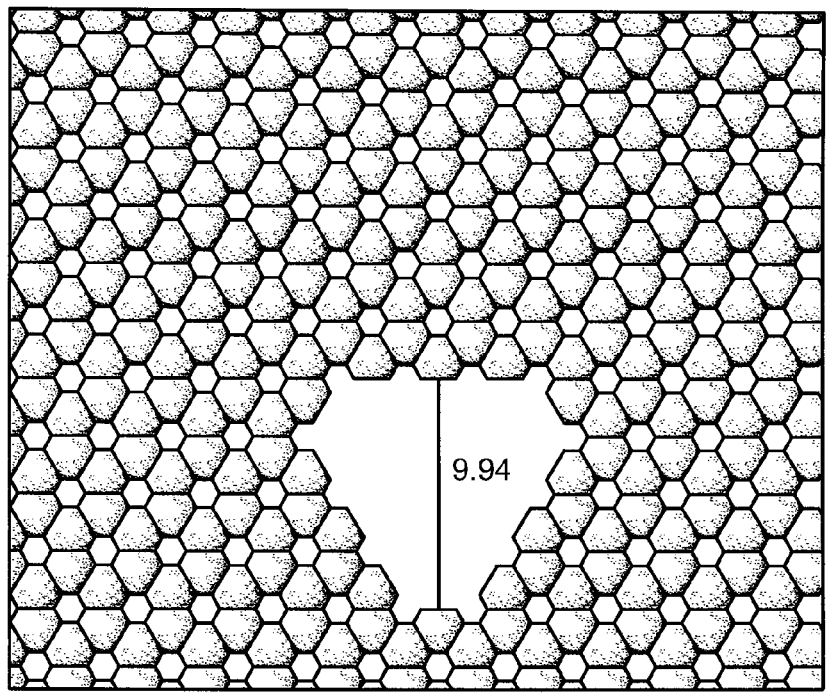
Figure 10B:
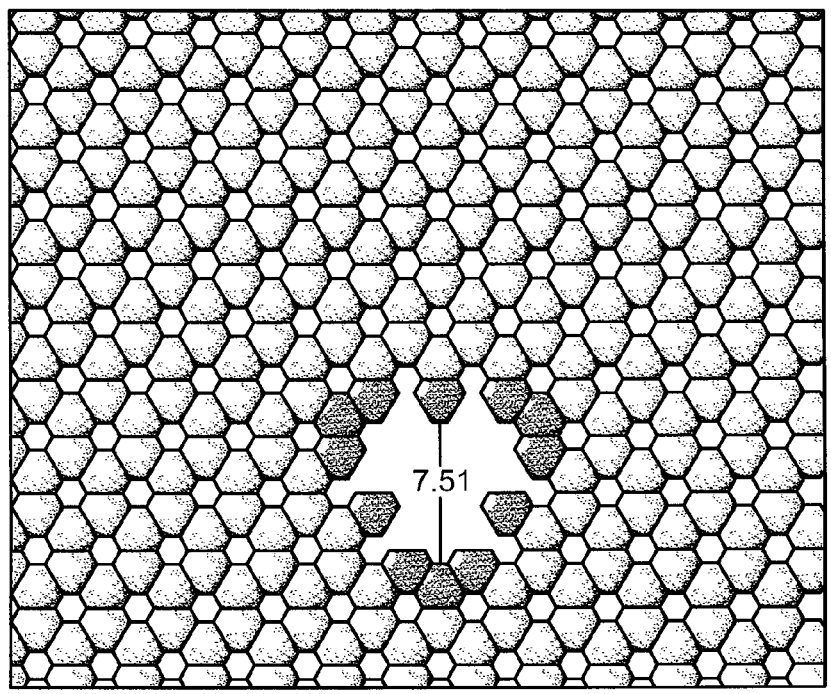
Figure 11A:
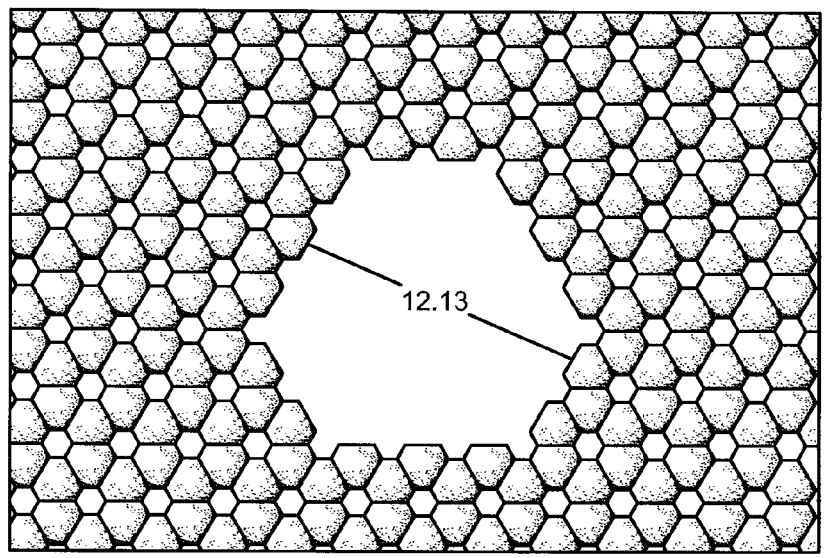
Figure 11B:
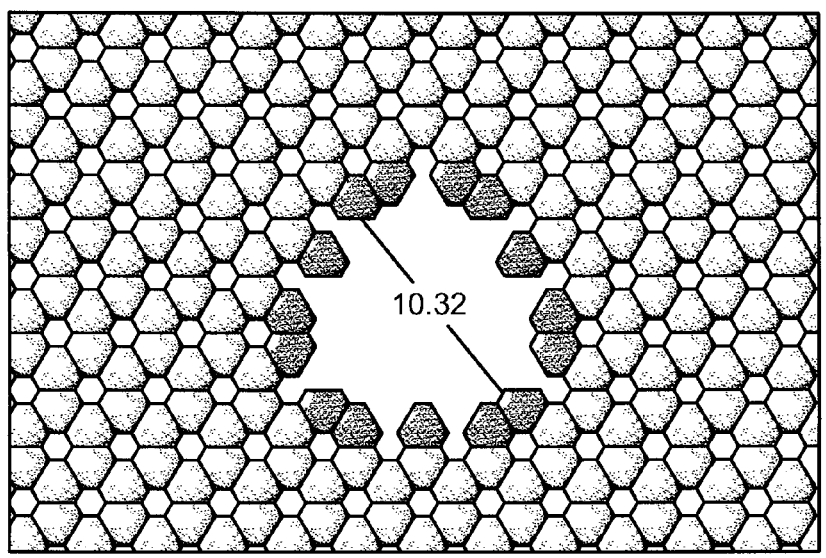
Figure 12A:
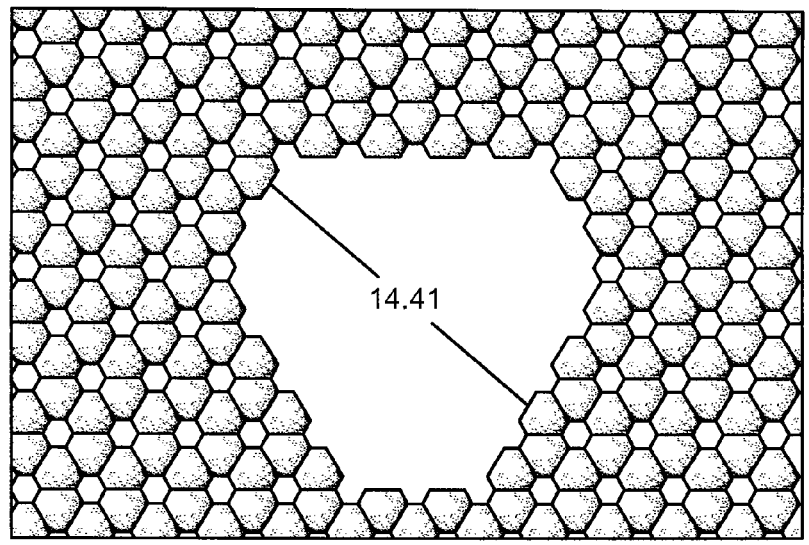
Figure 12B:
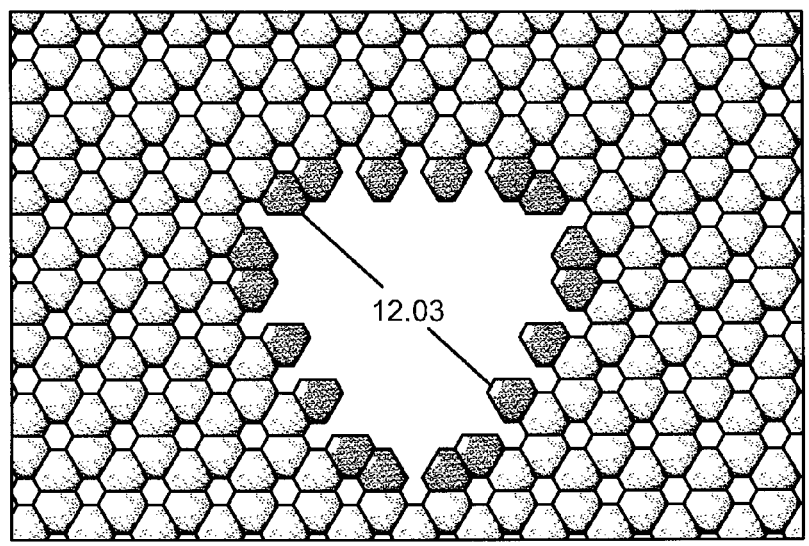
Figure 13A:
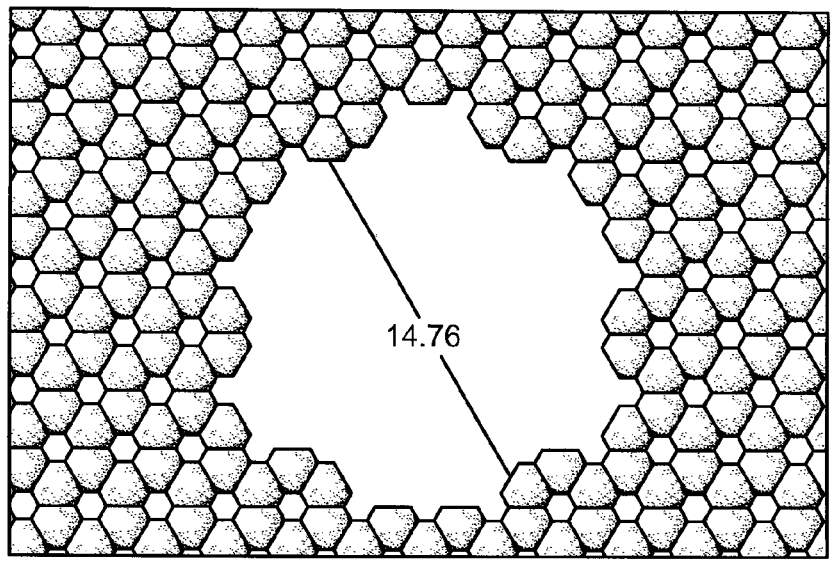
Figure 13B:
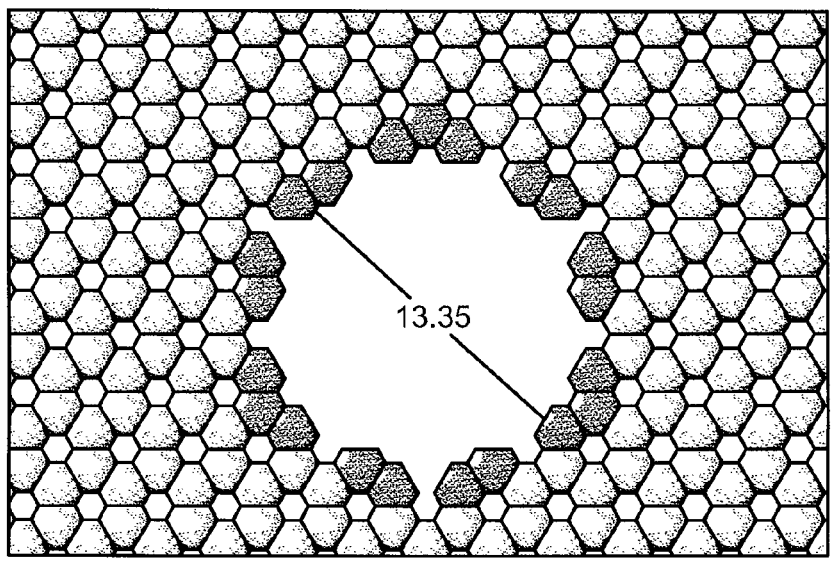

With reference to the above Table, the first five possible examples showing the removal of carbon atoms and the addition of oxygen atoms are respectively shown in FIGS. 9A, 9B, 10A, 10B, 11A, 11B, 12A, 12B, 13A, and 13B. Based strictly on the model used to develop the Table, FIG. 9A schematically shows the removal of 13 carbon atoms, which are shown lightly shaded, from a graphene lattice. FIG. 9B, which is also based on the model, schematically shows the addition of 9 oxygen atoms, which are shown darkly shaded, and which are disposed around an edge of a hole formed by the removal of the carbon atoms. As evidenced in the Table, such a hole formed by the oxygen atoms would have an effective diameter of 5.28 Angstroms. FIGS. 10A, 10B, 11A, 11B, 12A, 12B, 13A, and 13B schematically illustrate the next four examples of removing carbon atoms and adding oxygen atoms as suggested by the above Table.

One method of oxygen functionalization or passivation, which may also be referred to as oxidation, is the cleaving of carbon-carbon bonds in an oxidizing environment. Other methods could include post-cutting substitution by various aromatic substitutional chemistries known in the art of organic chemistry.

The disclosed approach is scalable to large-area atomically thin materials or films. Functionalized carrier molecules can be applied to the material or film via a number of routes. For example, a solution containing an appropriate concentration of functionalized cutter molecules could be spray coated, dip coated or otherwise applied to the atomically thin material or film (on appropriate substrate or carrier). Or, cutter molecules could be delivered to the atomically thin material or film via gas phase. Both approaches are scalable.

The target film to be perforated by this technique does not have to be graphene. Alternately, the film could be any two-dimensional material. Examples include but are not limited to molybdenum disulfide, boron nitride, hexagonal boron nitride, niobium diselenide, silicene, and germanene or even thicker film materials or multiple layers of two-dimensional materials provided the "cutter" chemistry can effectively cut through the entire film thickness.

Thus, it can be seen that the objects of the invention have been satisfied by the structure and its method for use presented above. While in accordance with the Patent Statutes, only the best mode and preferred embodiment has been presented and described in detail, it is to be understood that the invention is not limited thereto or thereby. Accordingly, for an appreciation of the true scope and breadth of the invention, reference should be made to the following claims.

What is claimed is:

1. A method for forming a lattice with holes, comprising:
   disposing cutter molecules with a plurality of a reactive species attached about the periphery of each said cutter molecule on to a lattice, said reactive species cutting molecular bonds of the lattice so as to form holes in the lattice
   wherein said cutter molecules are selected from the group consisting of pyrene, napthalene, anthracene, and perylene.

2. The method according to claim 1, further comprising: providing a lattice which comprises a graphene lattice and wherein said reactive species cuts carbon-carbon bonds of said graphene lattice.

3. The method according to claim 1, wherein said holes range in size from about 0.5 nm to about 2.2 nm.

4. The method according to claim 1, further comprising: providing multiple layers of graphene to form the lattice.

5. The method according to claim 1, further comprising: providing said cutter molecule as a substantially planar molecule.

6. The method according to claim 5, further comprising:
selecting a substituent in place of hydrogen as the reactive species attached about the periphery of each said substantially planar molecule, the substituent being an osmium bearing sidegroup or an oxidizing sub-group.

7. The method according to claim 1, further comprising:
selecting a material for the lattice from the group consisting of graphene, molybdenum sulfide, boron nitride, hexagonal boron nitride, niobium diselenide, silicene and germanene.

8. The method according to claim 7, further comprising:
providing said cutter molecule as a substantially planar molecule.

9. The method according to claim 1, further comprising:
selecting said cutter molecules such that cutting is initiated by application of light to said cutter molecules disposed on the lattice.

10. The method according to claim 1, wherein said holes are of the same size.

11. The method according to claim 1, further comprising:
functionalizing said plurality of said holes.

12. The method according to claim 11, further comprising:
using oxygen atoms to functionalize said holes.

13. The method according to claim 1, wherein said holes range in size from about 0.5 nm to about 100 nm.

14. The method according to claim 1, wherein said holes range in size from about 1 nm to about 100 nm.

* * * * *